United States Patent
Smith

(10) Patent No.: US 6,277,733 B1
(45) Date of Patent: Aug. 21, 2001

(54) OXYGEN-FREE, DRY PLASMA PROCESS FOR POLYMER REMOVAL

(75) Inventor: Patricia B. Smith, Colleyville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/408,022

(22) Filed: Sep. 29, 1999

Related U.S. Application Data

(60) Provisional application No. 60/103,047, filed on Oct. 5, 1998.

(51) Int. Cl.[7] .................................................. H01L 21/4763
(52) U.S. Cl. .......................... 438/636; 438/637; 438/687; 438/688; 438/700; 438/707; 438/714; 438/723; 438/737; 438/738; 438/743
(58) Field of Search ..................................... 438/636, 637, 438/700, 687, 688, 707, 714, 723, 737, 738, 743

(56) References Cited

U.S. PATENT DOCUMENTS 5,989,997  *  11/1999  Lin et al. ............................. 438/637
6,107,192  *  8/2000   Subrahmanyan et al. ........... 438/637

* cited by examiner

*Primary Examiner*—Jey Tsai
*Assistant Examiner*—Lynne A. Gurley
(74) *Attorney, Agent, or Firm*—Mark A. Valetti; Wade James Brady, III; Frederick J. Telecky, Jr.

(57) ABSTRACT

An embodiment of the instant invention is a method of fabricating an electronic device formed on a semiconductor wafer, the method comprising the steps of: forming a conductive structure over the substrate, the conductive structure comprised of an oxygen-sensitive conductor; forming a layer of dielectric material over the conductive structure (step 306 of FIG. 1); forming a photoresist layer over the layer of the dielectric material (step 308 of FIG. 1); patterning the layer of the dielectric material (step 308); removing the photoresist layer after patterning the layer of the dielectric material (step 312 of FIG. 1); and subjecting the semiconductor wafer to a plasma which incorporates the combination of hydrogen or deuterium and a fluorine-containing mixture which is comprised of a gas selected from the group consisting of: $CF_4$, $C_2F_6$, $CHF_3$, $CFH_3$ and other fluorine-containing hydrocarbon (step 313 of FIG. 1).

7 Claims, 5 Drawing Sheets

OXYGEN-FREE, DRY PLASMA PROCESS FOR POLYMER REMOVAL

This application claims priority under 35 USC §119(e)(1) of provisional application No. 60/103,047 filed Oct. 5, 1998.

CROSS-REFERENCE TO RELATED PATENT/PATENT APPLICATIONS

The following commonly assigned patent/patent applications are hereby incorporated herein by reference:

| Patent No./Serial No. | Filing Date | TI Case No. |
| --- | --- | --- |
| 60/066,568 | November 26, 1997 | TI-26189 |
| 60/066,590 | November 29, 1997 | TI-25250 |
| 60/103,455 | October 6, 1998 | TI-28051 |

FIELD OF THE INVENTION

The instant invention pertains to semiconductor device fabrication and processing and more specifically to post metal pattern and etch clean-up processing.

BACKGROUND OF THE INVENTION

Most semiconductor devices utilize multiple levels of metallization. With the increasing complexity of devices and the need to reduce the physical size of devices, the number of levels which incorporate metal connections is increasing. In addition, with the desire to increase the speed of the devices while reducing the power consumed by the devices, advanced metallization schemes are being developed. One such scheme involves the use of copper-doped aluminum or copper structures for the bus lines and interconnects. Additionally, interlevel dielectrics with lower dielectric constants than standard silicon dioxide films may be used as the dielectric material situated between metallic structures.

A problem that most semiconductor manufacturers face is the cleaning up of the metallic structures after the structures are patterned and etched. More specifically, the photoresist needs to be removed, and the residual metal halide etch byproducts have to be removed or converted to different chemical forms to avoid corrosion of the metal. These processes, commonly known as strip and passivation processes, may cause non-conducting residues to form on the metallic structure. In order to address this problem, a cleaning step is typically performed after the underlying metal structure is exposed and the photoresist is removed. The cleanup step will preferably remove all of the residue, typically comprised of polymers, that are formed on the metal structure, thus inhibiting corrosion of the metal structures. However, the clean step must not appreciably affect the electrical critical dimension (CD) of the metal structure.

For a typical Cu metallization scheme, a standard $H_2$ plasma strip process (see co-pending application Ser. No. 09/199,829, which is assigned to Texas Instruments) is performed to remove photoresist after a via oxide etch process. Since a photoresist strip with $O_2$ plasma causes substantial oxidation to any exposed Cu at the bottom of the via, this approach is generally not used. This is so even though a $Si_3N_4$ barrier layer is present, and the via etch process completes to the $Si_3N_4$ layer, without passing through the $Si_3N_4$ layer. The nitride layer must then be removed in a separate wet or dry etch process. Thus, a dry plasma etch process which could be used to remove photoresist without oxidation of Cu would simplify the process flow by either eliminating the need for the $Si_3N_4$ barrier layer, or substantially thinning it (it might still be useful as an etch stop layer for via formation). Removal or thinning of the $Si_3N_4$ barrier layer would ease the oxide etch selectivity requirements since stopping the etch on the $Si_3N_4$ layer would not be necessary.

SUMMARY OF THE INVENTION

An embodiment of the instant invention is a method of fabricating an electronic device formed on a semiconductor wafer, the method comprising the steps of: forming a conductive structure over the substrate, the conductive structure comprised of an oxygen-sensitive conductor; forming a layer of dielectric material over the conductive structure; forming a photoresist layer over the layer of the dielectric material; patterning the layer of the dielectric material; removing the photoresist layer after patterning the layer of the dielectric material; and subjecting the semiconductor wafer to a plasma which incorporates the combination of hydrogen or deuterium and a fluorine-containing mixture which is comprised of a gas selected from the group consisting of: $CF_4$, $C_2F_6$, $CHF_3$, $CFH_3$ and other fluorine-containing hydrocarbon. Preferably, the step of removing the photoresist layer is performed by subjecting the semiconductor wafer to the plasma which incorporates a gas which includes hydrogen or deuterium, including $NH_3$, $N_2H_2$, $H_2S$, $CH_4$ or deuterated forms of these gases. The oxygen-sensitive material is, preferably, comprised of: copper, tantalum, tantalum nitride, titanium, titanium nitride, titanium silicide, tungsten, tungsten nitride, tungsten silicide, aluminum, copper-doped aluminum, silver, gold, ruthenium, ruthenium oxide, iridium, platinum, cobalt, cobalt silicide and any combination thereof. Preferably, the fluorine-containing mixture is around 2 to 10% of the combination (more preferably, around 4% of the combination). The step of subjecting the semiconductor wafer to a plasma which incorporates the combination of hydrogen or deuterium and a fluorine-containing mixture removes any exposed hydrocarbons formed over the semiconductor wafer and does not substantially remove any exposed nitride-containing structures.

Figure 1:
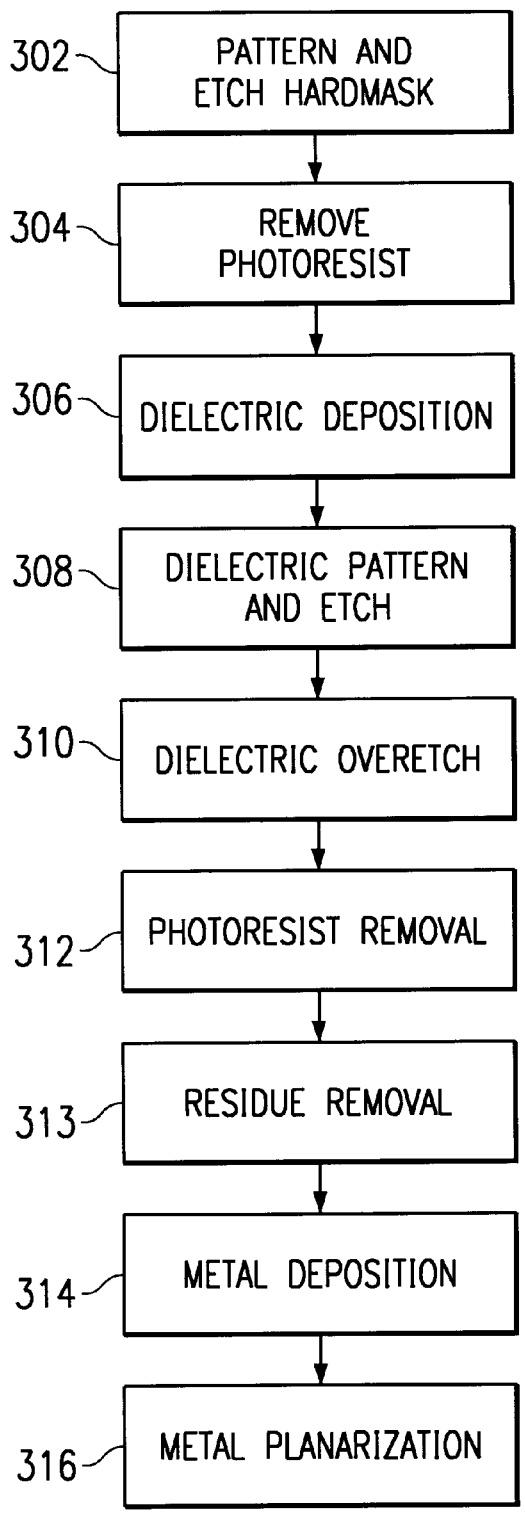
FIG. 1 is a flow diagram illustrating the method of an embodiment of the instant invention. This method is preferably utilized in a dual damascene process flow where oxygen-sensitive (metal) structures may be exposed (during the via etch process, preferably).

Common reference numerals are used throughout the figures to designate equivalent or substantially similar structures.

DETAILED DESCRIPTION OF THE DRAWINGS

While the methods of the instant invention are described with reference to FIGS. 1–2h, the methods of the instant invention can be applied to any type of device structure (e.g. metal interconnects, metal lines, metal gates, or other conductive structures) and to any type of device (e.g. memory devices, logic devices, power devices, DSPs, or microprocessors). In addition, the method of the instant invention can be used to remove residue from other device structures. Furthermore, while the methods of the instant invention, as described below, revolve around the use of hydrogen plasma, other plasmas may be used (such as a deuterium plasma, or other hydrogen-containing plasmas, such as $NH_3$, $N_2H_2$, $H_2S$ and $CH_4$, and deuterated forms of these gases, for example).

The following method of one embodiment of the instant invention should preferably be used in a process flow where there are exposed portions of oxygen-sensitive conductive structures and/or oxygen sensitive dielectric materials.

Figure 2A:
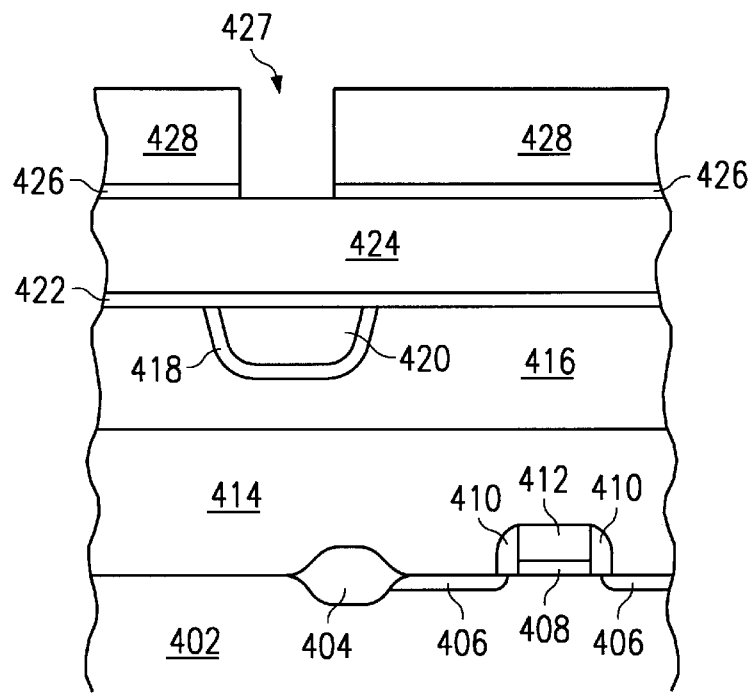
FIGS. 2a–2h are cross-sectional views of a semiconductor device which is fabricated using the method of the instant invention (which is illustrated in FIG. 1), incorporated into a dual damascene process flow where oxygen sensitive metal is exposed (during the via etch process, preferably).

Referring to step 302 of FIG. 1 and FIG. 2a, after providing substrate 402, isolation region 404 (which could be formed using LOCOS, field oxidation, or shallow trench isolation techniques), source/drain regions 406, gate dielectric 408, conductive gate structure 412, sidewall insulators 410, dielectric layer 414 (preferably comprised of BPSG, PSG, silicon oxide, oxide/nitride stack, TEOS, a low dielectric constant material, or any other interlevel dielectric material—in fact, regions 414 and 416 can be one layer) liner/barrier layer 418 (preferably comprised of Ti, TiN, a Ti/TiN stack, Ta, TaN, or a Ta/TaN stack), conductor 420 (preferably comprised of aluminum, copper, copper-doped aluminum, or any other refractory metal), barrier layer 422 (preferably comprised of silicon nitride), dielectric layer 424 (preferably comprised of FSG, BPSG, PSG, TEOS, aerogel, xerogel, HSQ or any other low dielectric constant material), photoresist layer 428 is formed and patterned over hardmask layer 426. Preferably, hardmask layer 426 is comprised of an oxide, an oxide/nitride stack, or silicon nitride (most preferably, it is comprised of a nitride). Using the photoresist as a mask, hardmask 426 is etched so as to create opening 427 in the hardmask. Opening 427 is preferably aligned with underlying metal structure 420.

Figure 2B:
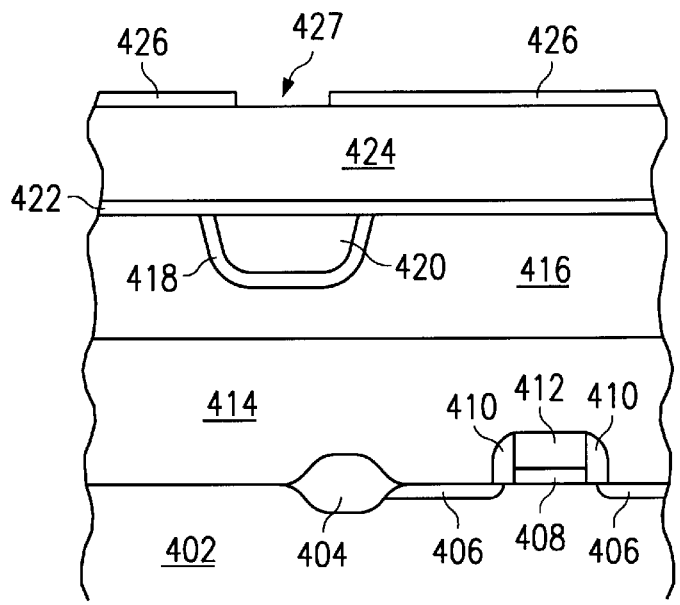

Referring to step 304 of FIG. 1 and FIG. 2b, photoresist 428 is removed. This may be accomplished by using an oxygen ash step followed by a clean-up step, but is preferably done (in the case of oxygen-sensitive metallization—Cu metallization) by subjecting the wafer to a hydrogen-containing plasma so as to remove the photoresist and any residue. The standard $O_2$ strip process to remove the photoresist will form an extremely thick Cu-oxide layer and, therefore, should not be utilized to strip the photoresist. A low temperature (25–100 C) strip with $O_2$ is one alternative, but is not a standard photoresist strip. Preferably, the wafer temperature during the photoresist removal and clean step is on the order of 150 to 350 C (more preferably around 240 to 250 C). While a hydrogen plasma is preferable, one or more forming gases (such as $N_2$ or Ar) can be added and/or deuterium or other hydrogen-containing gases such as $NH_3$, $N_2H_2$, $H_2S$, or $CH_4$, or deuterated forms of these gases, for example, may be used instead of hydrogen. A subsequent clean-up step can be performed but it is not necessary.

Figure 2C:
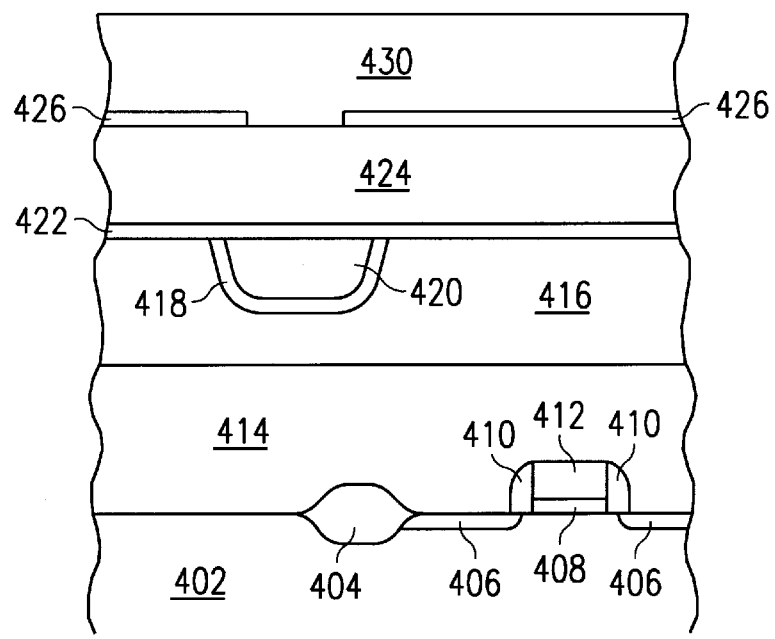

Referring to step 306 of FIG. 1 and FIG. 2c, a dielectric material is formed on hardmask 426. Preferably, dielectric layer 430 is comprised of TEOS, FSG, BPSG, PSG, HSQ, or a low dielectric constant material, such as aerogel, xerogel, or a polymer (such as fluorinated parylene). Dielectric layer 430 is preferably either spun on or deposited using chemical vapor deposition (CVD).

Figure 2D:
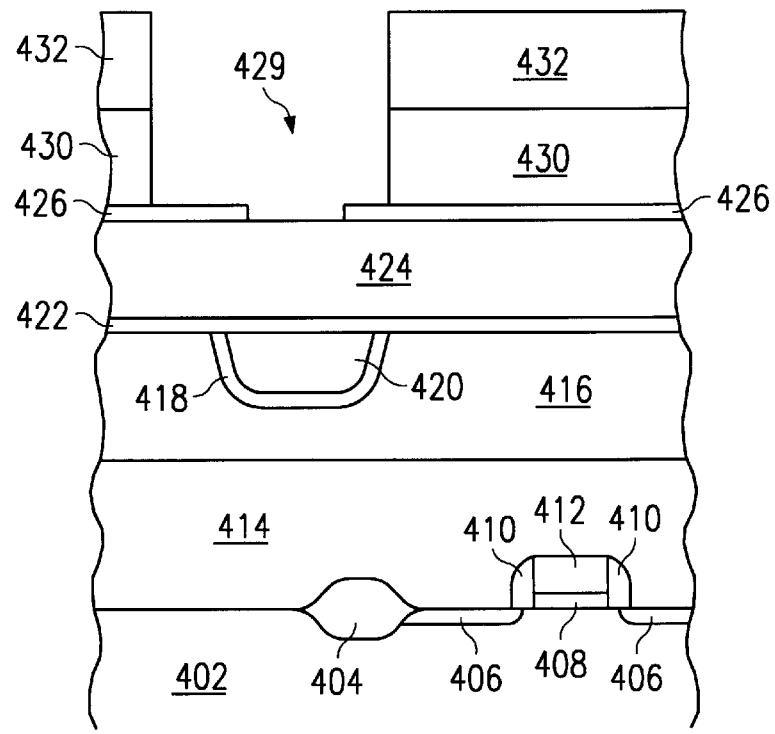
Figure 2E:
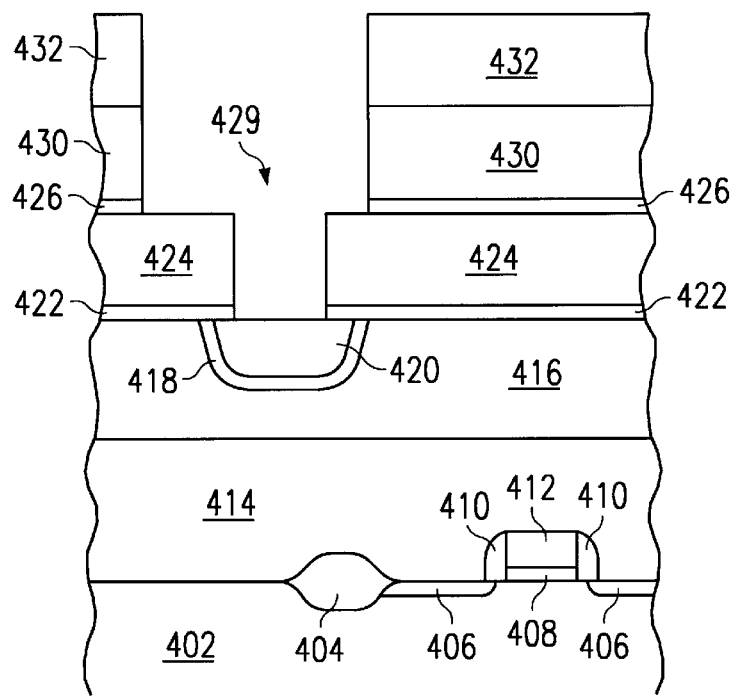

Referring to step 308 of FIG. 1 and FIG. 2d, photoresist layer 432 is formed with a pattern. This is followed by an etch process to remove the exposed portions of dielectric layers 430 and 425, and create trench/via opening 429. Preferably, this etch process is an anisotropic process, and, more preferably, it is performed using $CHF_3$, $CF_4$ or other fluorinated hydrocarbon plasma chemistry. Referring to step 310 of FIG. 1 and FIG. 2e, an overetch process is performed to ensure completion of the dielectric etch and, consequently, the via formation. During this processing, portions of barrier layer 422 may be removed thereby exposing the metal (Cu) layer 420.

Figure 2F:
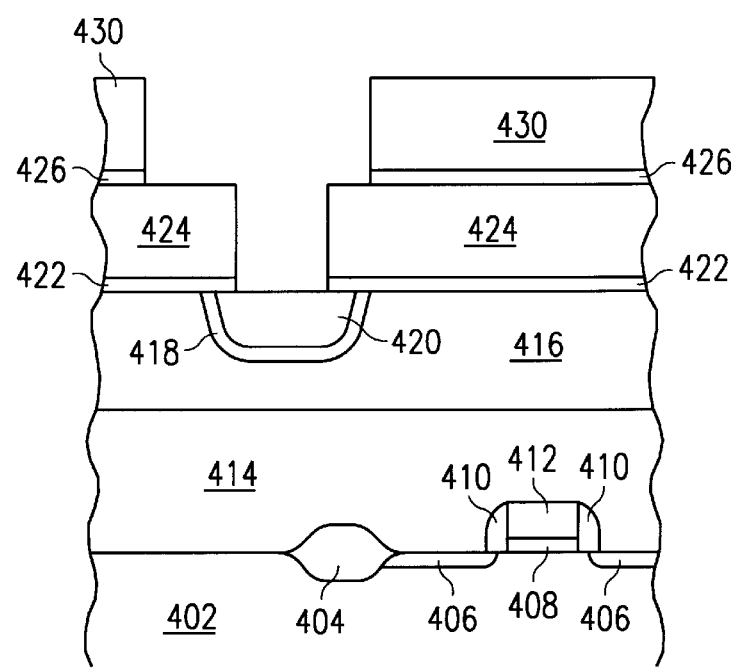

Referring to step 312 of FIG. 1 and FIG. 2f, photoresist 432 is removed. For oxygen sensitive metals such as Cu, this may be accomplished by the method illustrated in co-pending application Ser. No. 09/199,829. In addition, the method of the instant invention can be used at this point to remove the photoresist and any polymer formed on the sides of the via or the trench, the top of conductor 420, the surface of the dielectric 430, and any remaining portions of the barriers 420 and 426. The traditional oxygen photoresist strip step should not be performed in this case, or if the exposed dielectric material is oxygen sensitive. Thus, the wafer should be subjected to a hydrogen-containing plasma so as to remove the photoresist. Preferably, the wafer temperature during this step is on the order of 150 to 350 C (more preferably around 240 to 250 C). While a hydrogen plasma is preferable, one or more forming gases (such as $N_2$ or Ar) can be added and/or deuterium or other hydrogen-containing plasmas, such as $NH_3$, $N_2H_2$, $H_2S$, or $CH_4$, or deuterated forms of these gases, for example, may be used instead of hydrogen.

A subsequent clean-up step (step 313) is preferably performed, next, so as to remove any polymer that is formed on the sidewalls of the via or the trench, on the underlying metal 420, on the surface of the dielectric 430, and any remaining portions of barriers 422 and 426. The preferable clean-up step 313 would include the method of the instant invention. More specifically, the wafer would be subjected to a plasma which contains $H_2$ (deuterium or a hydrogen-containing gas, such as ammonia, can be used in place of $H_2$) and $CF_4$, (or other fluorocarbon, such as $C_2F_6$, $CHF_3$, $CH_2F_2$ or other fluorine-containing hydrocarbon, where $CF_4$ is around 2 to 10% of the mixture—more preferably around 4%, at a wafer temperature around 100 to 400 C (more preferably around 200 to 350 C—more preferably around 245 C). This clean-up step of the instant invention will remove any hydrocarbon residue left on metal structure 420. In addition, this step will neither oxidize any exposed portions of underlying oxygen-sensitive conductor 420, nor will it substantially etch any exposed portions of silicon nitride (such as the portion of barrier 426 which may overlie conductor 420) or other nitride-containing structures.

Before step 314, the etch stop layer 422, and whatever remains of layer 426 should be completely removed to allow the metal 420 to contact the liner 434 and consequently the next metal level 436. Following the removal of layer 422 the surface of the metal 420 should be thoroughly cleaned to assure good contact between metal 420 and the liner 434. The clean of metal 420 is accomplished by the method of the present invention. A fluorinated hydrogen or hydrogen containing plasma is used to remove polymer/residues from the exposed surfaces. Reduction of any Cu-oxides (from air exposure, for example) to Cu-metal would occur, and no loss or attack of the exposed dielectric or silicon nitride layers would occur.

Figure 2G:
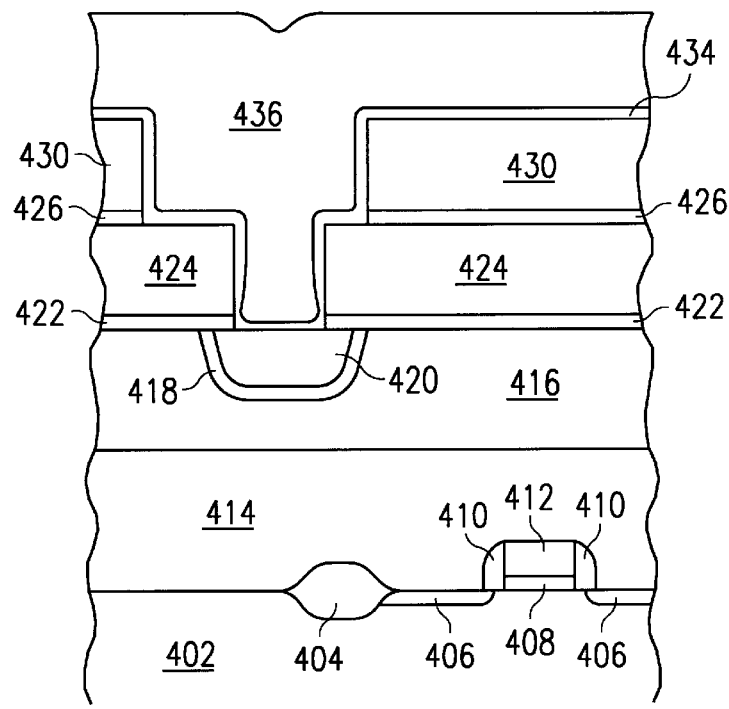

Referring to step 314 of FIG. 1 and FIG. 2g, a metal or other conductive material is formed over the liner 434. Liner layer 434 is preferably comprised of Ti, TiN, a Ti/TiN stack, Ta, TaN, or a Ta/TaN stack. Preferably, metal layer 436 is comprised of aluminum, copper, copper-doped aluminum (preferably on the order of 0.5 to 5%; more preferably on the order of 1 to 2%), or any other refractory metal. Metal layer 436 is preferably formed by electroplating, PVD or CVD or a combination thereof.

Figure 2H:
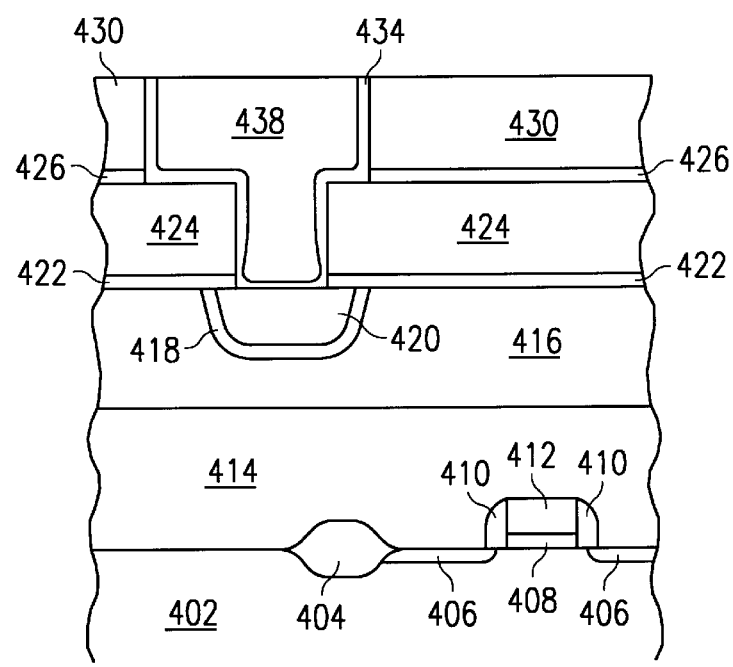

Referring to step 316 of FIG. 1 and FIG. 2h, metal structure 436 is planarized so as to form via and conductive line 438. Preferably, this planarization step is accomplished by CMP or a blanket etch-back step. The portion of liner/barrier 434 which is situated above dielectric 430 may be removed during this step, or it can be removed in a subsequent step.

While FIGS. 1–2h illustrate a dual damascene process, the instant invention can be used on any type of damascene process or any other type of metallization process. One of ordinary skill in the art should be able to extrapolate the use of the instant invention in many different types of structure formation schemes based on his or her knowledge and the teachings in the instant specification.

While the embodiments of the instant invention are described above with regards to removing residue from metallic structures, the instant invention is equally applicable to removing residue from the sidewalls and other exposed portions of the dielectric layer. More specifically, residue, which is produced by the reaction of the photoresist with the fluorine-containing chemistry (used to etch the openings in the dielectric layers—preferably comprising an oxide) and the dielectric material itself, forms both on the underlying metallic structure and on the exposed portions of the dielectric layer and is readily removed using any of the embodiments of the instant invention. Hence, when vias or openings are formed in the dielectric layers (which are covered with patterned photoresist), residues form on the sidewalls of the vias/openings in the dielectric layer, on the surface of the exposed dielectric layer, and on the portion of the underlying conductor which is exposed by this newly formed via/opening in the dielectric layer. This residue can be removed by the method of the instant invention.

Although specific embodiments of the present invention are herein described, they are not to be construed as limiting the scope of the invention. Many embodiments of the present invention will become apparent to those skilled in the art in light of the methodology of the specification. The scope of the invention is limited only by the claims appended.

What I claim is:

1. A method of fabricating an electronic device on a semiconductor substrate, said method comprising the steps of:
   forming a conductive structure over said substrate, said conductive structure comprised of an oxygen-sensitive conductor capable of being oxidized when contacted by oxygen;
   forming and patterning a layer of dielectric material over said substrate with said conductive structure exposed; and
   subjecting said semiconductor substrate with patterned dielectric and exposed conductive structure to the combination of an active oxygen-free, hydrogen, hydrogen-containing, deuterium or deuterium-containing plasma which incorporates a fluorocarbon gas.

2. The method of claim 1, wherein said step of patterning of said dielectric layer comprises the steps of forming a photoresist layer over said layer of said dielectric material; patterning said layer of said dielectric material and removing said photoresist layer after patterning said layer of said dielectric material, said step of removing said photoresist layer being performed by subjecting said semiconductor substrate to said plasma which incorporates a gas which includes $NH_3$, $N_2H_2$, $H_2S$, $CH_4$ or deuterated forms of these gases.

3. The method of claim 1, where said oxygen-sensitive material is comprised of a material selected from the group consisting of: copper, tantalum, tantalum nitride, titanium, titanium nitride, titanium silicide, tungsten, tungsten nitride, tungsten silicide, aluminum, copper-doped aluminum, silver, gold, ruthenium, ruthenium oxide, iridium, platinum, cobalt, cobalt silicide and any combination thereof.

4. The method of claim 1, wherein said fluorocarbon gas is from about 2 to about 10% of said combination.

5. The method of claim 4, wherein said fluorocarbon gas is about 4% of said combination.

6. The method of claim 1, wherein said step of subjecting said semiconductor substrate to a plasma removes any exposed hydrocarbons formed over the semiconductor substrate.

7. The method of claim 1, wherein said step of subjecting said semiconductor substrate to a plasma does not substantially remove any exposed nitride-containing structures.

* * * * *